United States Patent [19]

Clohset

[11] Patent Number: 5,384,747

[45] Date of Patent: Jan. 24, 1995

[54] CIRCUIT FOR PLACING A MEMORY DEVICE INTO LOW POWER MODE

[75] Inventor: Steven J. Clohset, Cypress, Tex.

[73] Assignee: Compaq Computer Corporation, Houston, Tex.

[21] Appl. No.: 178,496

[22] Filed: Jan. 7, 1994

[51] Int. Cl.⁶ .................. G11C 5/14; H03K 17/24
[52] U.S. Cl. .................. 365/226; 365/227; 365/229; 307/64
[58] Field of Search ............ 365/226, 227, 228, 229; 307/64, 66

[56] References Cited

U.S. PATENT DOCUMENTS

| | | | |
|---|---|---|---|
| 4,590,553 | 5/1986 | Noda | 364/200 |
| 4,715,016 | 12/1987 | Lamiaux et al. | 365/229 |
| 4,816,862 | 3/1989 | Taniguchi et al. | 365/229 |
| 4,831,595 | 5/1989 | Bone | 365/229 |
| 4,984,211 | 1/1991 | Tran | 365/229 |
| 5,099,453 | 3/1992 | Steele | 365/229 |
| 5,109,505 | 4/1992 | Kihara | 365/229 |
| 5,243,527 | 9/1993 | Ueda et al. | 365/229 |

Primary Examiner—Eugene R. LaRoche
Assistant Examiner—Tan Nguyen
Attorney, Agent, or Firm—Pravel, Hewitt, Kimball & Krieger

[57] ABSTRACT

A circuit that allows an SRAM to automatically switch into low power mode before its power supply voltage input is brought to a lower voltage when the computer is turned off. The circuit includes a device that drives a chip enable input of the SRAM. The device is controlled by a signal indicating whether power is available to the computer system. If the system power is disconnected, the device asserts a low state to the chip enable input of the SRAM. The circuit also includes a device for gradually decreasing the voltage at the power supply voltage input of the SRAM from the system voltage down to the RTC/CMOS memory voltage, which is provided by a separate battery when the computer is shut off. The power supply input voltage is gradually decreased to allow the SRAM enough time to enter into its low power mode. By delaying the switch from the system power supply voltage to the RTC/CMOS memory voltage until it is certain that the SRAM has entered into a low power state, a very small amount of current is drawn from the battery. As a result, the amount of voltage drop across a resistive network connecting the SRAM to the battery is significantly lower, and therefore, the SRAM is able to retain its data.

12 Claims, 2 Drawing Sheets

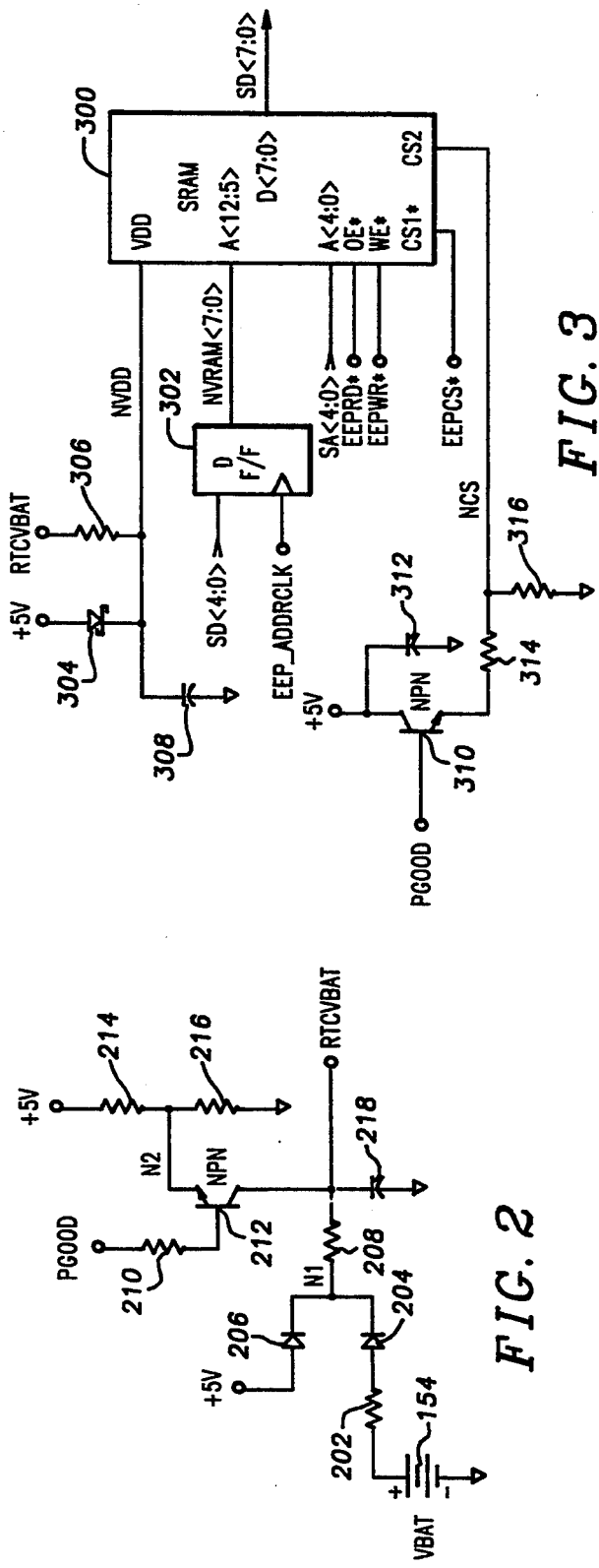
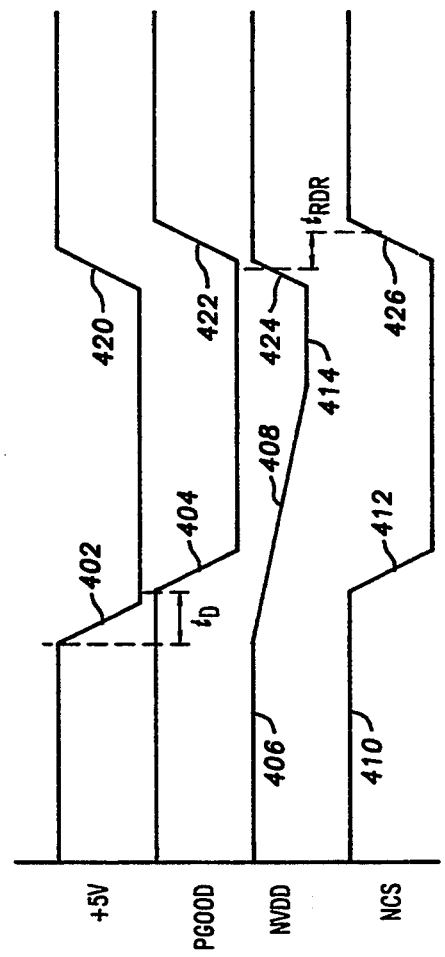
FIG. 3
FIG. 2
FIG. 4

CIRCUIT FOR PLACING A MEMORY DEVICE INTO LOW POWER MODE

BACKGROUND OF THE INVENTION

1. Field of the Invention

The invention relates to a computer system having CMOS memory for storing system configuration parameters and more particularly to a circuit that allows the CMOS memory to switch into low power mode automatically when the personal computer system is turned off.

2. Description of the Related Art

As personal computers have become more powerful, the amount of configuration information needed for the initialization of the computer systems have also increased. When International Business Machines Corporation (IBM) introduced the PC/AT, its second major generation of personal computers, one of the components used in the computer was a small CMOS memory. A real time clock (RTC) was also provided in the computer systems to perform real time clock functions. Because of the relatively limited capabilities of the PC/AT, which utilized the bus standard now known as the Industry Standard Architecture (ISA), a small CMOS memory unit was deemed sufficient to store the system configuration information. However, as personal computers became progressively more powerful, the basic CMOS memory unit no longer had the storage capacity for all the system configuration parameters required. As a result, an extended CMOS memory area was added to the personal computer systems. Generally, the size of each of the basic CMOS memory area and the extended CMOS memory area was 64 bytes.

As computer system components grew ever more powerful, a new bus standard known as the Extended Industry Standard Architecture (EISA) was developed to take advantage of the extra options and features available from the components. An EISA computer system includes a 32-bit address bus, a 32-bit data bus and expansion slots that are capable of accepting both EISA and ISA expansion boards. One of the features available in EISA systems is the capability of providing for automatic configuration for the system board, expansion boards plugged into the expansion bus, peripheral devices built into the system board, and software drivers that use system resources. To support automatic configuration by the system, the system board and the expansion boards each include a configuration file that contains the expansion ID, system resource requirements, and initialization information. The configuration files are utilized by a configuration utility provided with the EISA system to resolve conflicts in assignments of system resources, such as interrupt levels and DMA channels, and also to extract initialization information that is used for system board and expansion board initialization. The extracted initialization information for the system and expansion boards are stored in a nonvolatile memory by the configuration utility.

To store the expansion board ID, system resource requirements and initialization information for the system board and all the expansion board devices in the EISA system and other desired configuration and status information, approximately 8K bytes of memory capacity is required. An EEPROM has typically been used in systems to store the EISA configuration information because of its ability to retain data when the computer system power supply voltage is removed. However, because of the relatively high cost of the EEPROM, the computer system according to the preferred embodiment of the present invention uses a low-power 8 KB SRAM to store the EISA configuration information. However, a problem associated with the use of an SRAM is that it is a non-volatile memory. Thus, if the computer system power supply voltage is removed from the SRAM, all data in the SRAM would be lost. To avoid such loss of data, it would be desirable to connect the SRAM to an alternative source of power when the computer system power is turned off. As noted above, an RTC and basic and extended CMOS memory are provided with the computer system. Since these devices must also be provided with a supply voltage when the computer is shut off, a battery is provided with the computer system to provide an alternate power source. One alternative to provide this battery power has been taken by Dallas Semiconductor, which places a lithium battery inside the package containing the RTC/CMOS memory units and includes the additional SRAM needed for an EISA system. However, this alternative is even more expensive than the use of EEPROM but is used in instances where the limited number of write cycles to an EEPROM is a concern.

In current systems, power conservation is goal, so the use of 3.3V components is becoming more common. In these systems, the voltage provided to the RTC/CMOS memory units is typically clamped at 3.3V when the computer is on. When the computer is shut off, the battery is immediately connected to the RTC/CMOS memory for the devices to remain functional. This battery used to power the RTC/CMOS memory units can be used to supply the SRAM when the computer system power is disconnected, but it is necessary to use an SRAM with a low power, low voltage data retention mode to avoid loss of data stored in the SRAM and to avoid draining the battery. The SRAMs include a chip enable input that if deasserted, places the SRAM into a low power standby mode. It has been found that if the SRAM is not placed in the low power mode prior to reducing the voltage to that of the RTC/CMOS memory battery, data loss in the SRAM may occur. Therefore, it is desired that a circuit be developed that automatically places the SRAM into a low power state before the power supply input voltage is decreased from the computer system supply to the RTC voltage.

SUMMARY OF THE PRESENT INVENTION

According to the present invention, a circuit is implemented that allows an SRAM to automatically switch into low power mode before its power supply voltage input is brought to a lower voltage when the computer is turned off. The circuit includes a device that drives a chip enable input of the SRAM. The device is controlled by a signal indicating whether power is available to the computer system. If the system power is disconnected, the device will assert a low state to the chip enable input of the SRAM. The circuit also includes means for gradually decreasing the voltage at the power supply voltage input of the SRAM from the system voltage down to the RTC/CMOS memory voltage. The power supply input voltage is gradually decreased to allow the SRAM enough time to enter into its low power mode. If the power supply voltage input to the SRAM is switched from a high voltage value to a lower value before the SRAM has entered into its low power mode, then an amount of current equal to the full operating current of the SRAM would be drawn from the battery, causing a large current flow through a resistive network coupling the SRAM to the battery, which would in turn cause a large voltage drop across the resistive network. This may then cause the voltage at the power voltage input of the SRAM to reach a sufficiently low value to cause the SRAM to lose retention of its stored data. Therefore, by delaying the switch from the system power supply voltage to the RTC/CMOS memory voltage until it is certain that the SRAM has entered into a low power state, a very small amount of current is drawn from the battery. As a result, the amount of voltage drop across the resistive network connecting the SRAM to the battery is significantly lower, and therefore, the SRAM is able to retain its data.

BRIEF DESCRIPTION OF THE DRAWINGS

A better understanding of the present invention can be obtained when the following detailed description of the preferred embodiment is considered in conjunction with the following drawings in which:

FIG. 2 is a schematic diagram illustrating the power supply to the RTC/CMOS memory units;

FIG. 3 is a schematic diagram illustrating the SRAM and its interfacing; and

FIG. 4 is a timing diagram illustrating wave forms of signals of the SRAM of FIG. 3.

DETAILED DESCRIPTION OF THE PREFERRED EMBODIMENT

Figure 1:
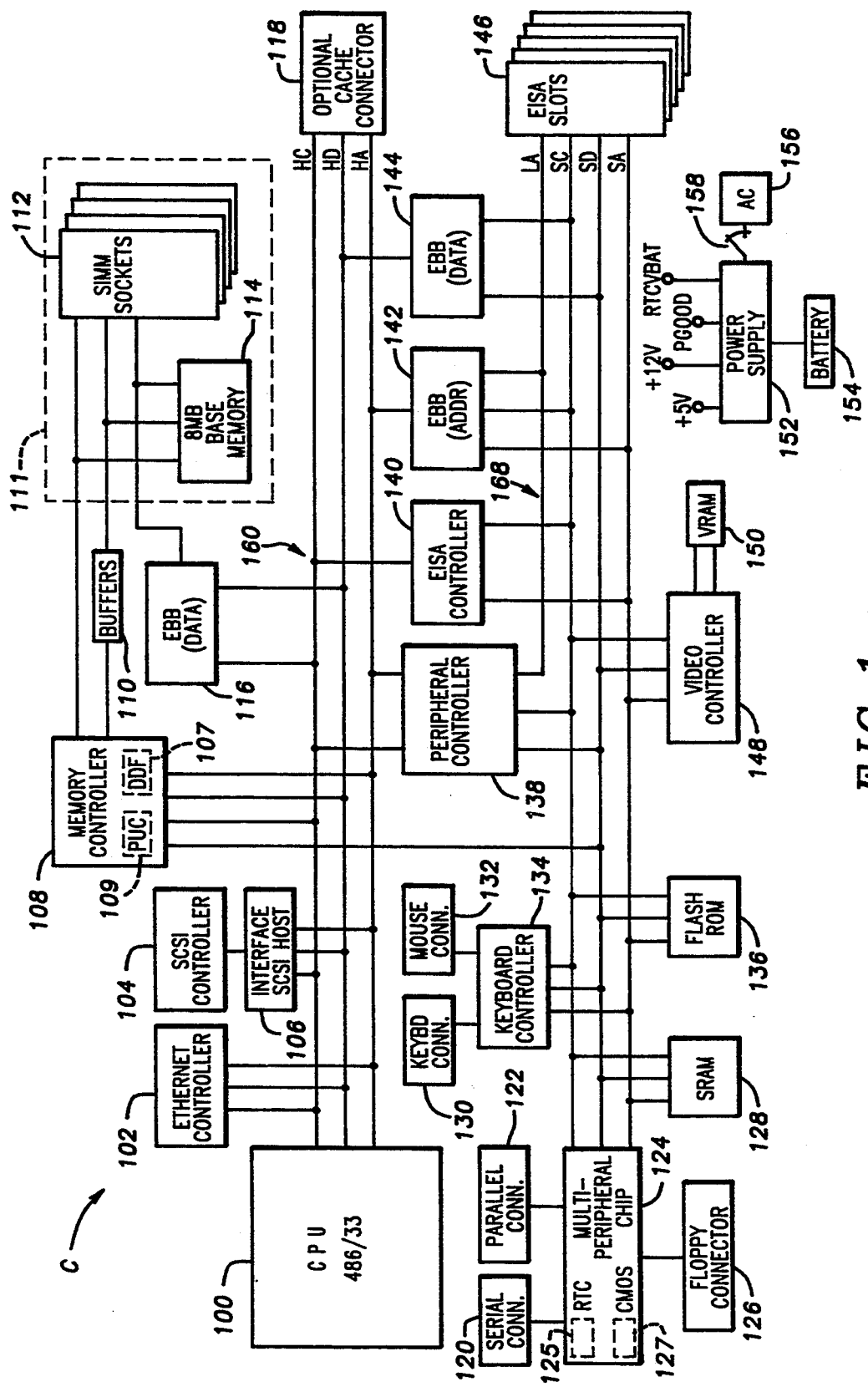
FIG. 1 is a block diagram of a computer system incorporating the present invention.

Referring to FIG. 1, a computer C is shown incorporating the preferred embodiment of the present invention. A microprocessor 100, preferably the 80486 processor from Intel Corporation, forms the main computing element of the computer C. The microprocessor 100 is connected to various system components via a host bus 160, which has three components, the HD or host data bus, the HA or host address bus and the HC or host control bus. Preferably, the HD bus is 32-bits wide and the HA bus is provided for a 32 addressing space. An Ethernet controller 102 is connected to the host bus 160 to allow the computer C to interface with a Local Area Network (LAN). A SCSI controller 104 is coupled to the host bus 160 through an interface 106. The SCSI controller 104 allows a SCSI hard disk drive (not shown) to be used as a mass storage device with the computer C. A memory controller 108 is also connected to the host bus 160. The functions of the memory controller 108 include providing the proper address and control signals to main memory 111. In the preferred embodiment, the main memory comprises an 8 MB (megabyte) base memory 114 and any additional memory devices inserted into SIMM sockets 112. The main memory 111 is upgradable via 4 SIMM sockets 112, up to a maximum of 128 MB of main memory storage capacity. A data buffer 116 provides latching and transceiving capabilities between the host data bus HD and the main memory 111. An optional secondary cache memory system can be connected to the host bus 160 through connector 118. Preferably, the secondary cache is a 256 KB, write-through cache.

An EISA bus 168 is also included as part of the computer system C. The EISA bus 168 has four major components, the SA and LA, or system and early address buses, the SD or system data bus, and the SC or system control bus. An EISA bus controller 140 provides the necessary capabilities to convert between host bus 160 cycles and EISA bus 168 cycles and is connected between the HC bus and the SC and SA buses. The EISA bus controller 140 is connected to control an EISA data bus buffer 144, which provides the necessary data transceiving functions between the host bus 160 and the EISA bus 168 and latching functions needed on the EISA bus 168. Similarly, the EISA bus controller 140 also provides the control function for an address EISA bus buffer 142. The address bus buffer 142 provides transceiving capabilities between the EISA bus 168 and the host bus 160, and in addition, latches the HA bus signals to form the SA bus signals as appropriate.

The computer C includes certain fundamental operations such as an interrupt system, a DMA controller, and a number of timers as well as arbitration of the EISA bus 168. These functions are all contained in the EISA system peripheral controller 138, which is connected to the HC and HA buses and the SC and SD buses. In the preferred embodiment, five EISA slots 146 are connected to the EISA bus 168. The EISA slots 146 are capable of receiving both ISA and EISA expansion boards. A video controller 148, which provides the necessary video signals to a CRT monitor display, is connected to the EISA bus 168. A video memory 150 preferably implemented with video RAMs is connected to the video controller 148. Also connected to the EISA bus 168 is a keyboard controller 134. A keyboard connector 130 and a mouse connector 132 provide the connections to an external keyboard and a mouse, respectively.

In the preferred embodiment, a FLASH EEPROM 136 is connected to the EISA bus 168. The EEPROM 136 contains certain basic operating routines to allow the computer to boot and to perform certain fundamental system functions, these routines being generically referred to as the BIOS. In a departure from conventional practice, the computer system C according to the present invention includes a static RAM 128, instead of a more conventional non-volatile memory, to store the EISA configuration and miscellaneous configuration and status information. In other systems, the non-volatile memory is typically implemented with EEPROMs, or other more expensive NVRAM variations, because of their capability to retain data when the computer is shut off. However, even EEPROMs are generally significantly more expensive then SRAMs. As a result, to reduce the overall cost of the computer system C, the low power SRAM 128 is used.

The memory controller 108 is shown connected to the SD bus. This connection is necessary because a processor utility chip (PUC) 109 is included as part of the memory controller 108. The processor utility chip 109 provides certain necessary utility operations for use with the microprocessor 100. The output of the processor utility chip 109 is preferably provided to the HC bus to provide control functions of the microprocessor 100. The memory controller 108 also includes a DDF or data destination facility device 107. The DDF 107 performs memory module enabling, address translation and memory segment or page property storage. The DDF 107 provides memory capabilities to indicate which particular bank of memory is to be enabled, performs address translation on a 128 kbyte boundary, and provides indications of certain characteristics of each 128 kbyte block, such as whether it is write protected, high speed and/or cacheable and whether that portion can be utilized by a writeback cache.

A multi-peripheral chip 124 is connected to the EISA bus 168. The multi-peripheral chip 124 provides an interface to a floppy disk drive through connector 126, a parallel port 122, and a serial port 120. The multi-peripheral chip 124 also includes a real-time clock (RTC) 125 and basic and extended CMOS memory 127. The RTC 125 provides various real-time clock functions.

As discussed in the previous section, the CMOS memory 127 provides storage for various system configuration information. Also discussed was that a separate non-volatile memory was used in most systems to store the EISA configuration and miscellaneous configuration and status information. However, as noted above, the SRAM 128 is used in the computer system according to the preferred embodiment of the present invention instead of a non-volatile memory for cost reasons. The control signals to the SRAM 128 are provided by the multi-peripheral chip 124. These signals include an address clock signal, a read signal, a write signal and a chip select signal. A power supply 152 provides outputs of 5-volt power voltage +5V, a 12-volt power voltage +12V, a signal PGOOD indicating availability of system power, and a voltage RTCVBAT. The voltage RCVBAT is connected to the RTC 125 and the CMOS memory 127 located in the multi-peripheral chip 124. The SRAM 128 is connected to the system power voltage +5 V, preferably at approximately 5 volts, when the computer C is on, and to the voltage RTCVBAT when the computer C is turned off.

The power supply 152 is shown connected to a battery 154 and an AC receptacle 156 through a switch 158. When the power supply 152 is connected to the AC receptacle 156, the voltage +5V, the voltage +12V and the signal PGOOD are all asserted to their respective power-on states. The voltage RTCVBAT is also connected to the external power source and is at a voltage of approximately 3.3 volts. When the power supply 152 is disconnected from the AC receptacle 156, the voltage +5V, the voltage +12V and the signal PGOOD are all pulled to ground. However., the power supply 152 connects the voltage RTCVBAT to the battery 154. As a result, supply voltage is provided to the SRAM 128, the RTC 125 and the CMOS 127 when the computer C is shut off.

Referring to FIG. 2, a portion of the power supply 152 is shown that provides the voltage RTCVBAT. As discussed above, the voltage RTCVBAT is connected to the system voltage +5V, when the computer C is turned on and to the battery 154 when the computer C is turned off. The battery 154, with its voltage VBAT, is connected through a resistor 202 to the anode of a diode 204. The battery voltage VBAT is preferably 4.5V. The system voltage +5V, is connected to the anode of a diode 206, whose cathode is connected to the cathode of the diode 204. The common node of the diodes 204 and 206 is indicated by node N1. A resistor 208 connects node N1 with the output voltage RTCVBAT. A capacitor 218, which is connected between the voltage RTCVBAT and ground, in conjunction with the resistor 208, provides a time constant that causes the voltage RTCVBAT to smoothly decrease or increase when the power source is switched between +5V, and the battery 154. The collector of an NPN transistor 212 is also connected to the output voltage RTCVBAT. The base of the transistor 212 is connected through a resistor 210 to the signal PGOOD, which indicates that power is available to the computer system. The emitter of the transistor 212, also labeled as node N2, is connected to the common node between two resistors 214 and 216, which form a voltage divider circuit. The resistors 214 and 216 are connected in series between the system voltage +5V, and ground. The resistance values of the resistors 214 and 216 are defined such that node N2 is preferably at approximately 3.17 volts. When the computer is on, the signal PGOOD is asserted high, causing the transistor 212 to turn on and be placed into saturated mode. This causes RTCVBAT to be clamped at a voltage equal to the voltage at node N2 plus the voltage across the collector-emitter junction of the saturated transistor 212. In the preferred embodiment, the voltage RTCVBAT is at approximately 3.3 volts when the computer is turned on. When the computer system is shut off, however, both the signal PGOOD and the system voltage +5V, fall to ground. This causes the transistor 212 to be cut off and the diode 206 to be reverse biased. As a result, the diode 204 is allowed to turn on. The voltage of node N1 is thus the battery voltage VBAT less the voltage drop across resistor 202 and the voltage drop across the diode 204. When the computer is off, the voltage RTCVBAT is equal to the voltage at node N1 less the voltage drop across the resistor 208. Consequently, the voltage of RTCVBAT is dependent upon the current drawn by the load connected to RTCVBAT. A higher current drawn by the load will cause the voltage at RTCVBAT to drop lower due to the voltage drops across the resistors 202 and 208. In the preferred embodiment, the voltage RTCVBAT ranges between 2.5 and 3.0 V when the computer C is turned off.

Referring to FIG. 3, an SRAM 300-is shown with its inputs connected to various signals and circuitry. The SRAM 300 is preferably a CMOS SRAM organized as 8K words×8 bits. Thus, 13 address input bits A<12:0> are needed to address the SRAM 300. The lower five address input bits A<4:0> are connected to a portion of the EISA address bus SA<4:0>. Because of the limited I/O addressing space on the system board, which corresponds to slot 0 on the EISA bus, only 33 bytes are dedicated to the non-volatile memory (in this case the SRAM unit 128). Of the 33 bytes, 32 bytes of I/O space are dedicated to the SRAM 300, while 1 byte of I/O space is dedicated to a register 302. The register 302 stores the upper 8 address bits of the SRAM 300. The input of the register 302 is connected to the EISA data bus SD<7:0>. The register 302 is reloaded whenever a signal EEP_ADDRCLK, which is a signal representing a decoded value of the register 302, is asserted by the multi-peripheral chip 124. Thus the EISA configuration data is read from and written to the SRAM 300 in 32-byte blocks, also referred to as pages. Data is read from and written to the SRAM 300 via a portion of the EISA data bus SD<7:0>. A signal EEPCS* is connected to the CS1* input of the SRAM 300. The EEPCS* signal is active when an operation is directed to one of the 32 I/O locations assigned to the SRAM 300. If the EEPCS* signal is asserted low and a CS2 input to the SRAM 300 is asserted high, then the SRAM 300 is placed into active mode. If either of the CS1* input is deasserted high or the CS2 input is deasserted low, the SRAM goes into low power standby mode. A signal EEPRD* is connected to the OE, input of the SRAM 300. To read the data from SRAM 300, the signal EEPRD* is asserted low. A signal EEPWR* is connected to the WE* input of the SRAM 300. When the signal EEPWR* signal is asserted low, data is written into the SRAM 300. Thus the EEPRD* and EEPWR* signals are used in combination with the EEPCS* signal to read from and write to the SRAM 300.

Connected to the power supply input VDD of the SRAM 300 are a resistor 306 and a Schottky diode 304. The node connecting to input VDD will be referred to as NVDD. The Schottky diode 304 connects the system voltage +5V, to node NVDD when the computer C is turned on. As a result, the voltage at NVDD is at approximately 4.7V. However, when the computer C is shut off, the system voltage +5V, falls to ground, causing the Schottky diode 304 to reverse bias, and as a result, the node NVDD is connected to the voltage RTCVBAT through the resistor 306. As noted above, the voltage at RTCVBAT ranges from 2.5 to 3 volts. Consequently, when the computer C shuts off or turns back on, the input VDD switches from 5 volts down to 2.5 to 3 volts, or vice versa, respectively. To prevent the power supply voltage input of the SRAM 300 from falling to a lower voltage value before the SRAM 300 has had a chance to enter into lower power mode, a capacitor 308 is connected between the node NVDD and ground. The resistor 306 and the capacitor 308 provide a time constant that causes the voltage at node NVDD to gradually decrease from approximately 4.7 volts down to approximately the voltage RTCVBAT.

One method of placing the SRAM 300 into low power mode is to deassert its CS2 input. Therefore, it is desirable that the signal connected to the CS2 input be deasserted low before the voltage at the node NVDD is brought to a lower state. To accomplish that, the circuit comprising the elements of an NPN transistor 310, a capacitor 312 and resistors 314 and 316 are connected to the CS2 input. The collector of the transistor 310 is connected to the system voltage +5V. Also connected to the collector of the transistor 310 is the decoupling capacitor 312. The base of the transistor 310 is connected to the signal PGOOD, indicating when asserted that the computer system is on. Thus, when the signal PGOOD is asserted high, the transistor 310 turns on and when the signal PGOOD is deasserted low, the transistor 310 is cut off. The emitter of the transistor 310 is connected to the input of a voltage divider circuit comprising the resistors 314 and 316. The resistance values of the resistors 314 and 316 are ratioed such that the voltage at the output of the voltage divider is substantially the same as the voltage at its input, that is, the resistance value of the resistor 316 is much greater than the resistance value of the resistor 314. Thus, when the signal PGOOD is asserted high, the system voltage +5V flows through the NPN transistor to the input of the voltage divider circuit. The voltage at node NCS, which is the output of the voltage divider circuit, is equal to the system voltage +5V less the voltage drop across the collector-emitter junction of the NPN transistor 310 and less the voltage drop across the resistor 314. The voltage at node NCS is thus 5% to 10% lower then the system voltage +5V. This voltage is adequate to be considered a high or active level at the CS2 input of the SRAM 300. When the computer C is shut off, the signal PGOOD is deasserted low and the transistor 310 is therefore cut off. As a result, the node NCS is pulled to ground through the resistor 316, so that the CS2 input is negated.

Thus, the chain of events of putting the SRAM 300 into a lower power mode is as follows. A timing diagram is provided in FIG. 4 showing the signals 5 V, PGOOD, NVDD and NCS. When the computer C is shut off, the system voltage +5V falls to ground, as indicated by edge 402. This causes the Schotkky diode 304 to be cut off. As a result, the voltage at node NVDD begins to fall gradually, as shown by edge 408, to a voltage equal to the voltage RTCVBAT less a very small voltage drop across the resistor 306, indicated by voltage level 414. The rate at which node NVDD falls is determined by the time constant defined by the resistor 306 and the capacitor 308. In the preferred embodiment, the time constant defined by the resistor 306 and the capacitor 308 is approximately 510 ms. The signal PGOOD begins to fall a short delay after +5V begins to fall, as indicated by timing parameter Td. In the preferred embodiment, the parameter Td has the value 10 ms. The signal PGOOD falling causes the voltage at node NCS to be pulled to ground, as shown by edge 412. As is shown in the timing diagram, the rate at which node NCS is pulled to ground is much faster than the rate at which the voltage at node NVDD is decreasing to level 414. As a result, the voltage at node NCS has fallen to a low state, thereby placing the SRAM 300 into low power standby mode, a substantial amount of time before node NVDD falls to voltage level 414, even though node NVDD began to fall before node NCS. The specifications of the preferred SRAM 300 require that the timing between when node NCS has fallen low and when node NVDD is beginning to fall is 0ns. In the preferred embodiment, due to the fact that the signal PGOOD falls a short delay after system voltage +5V this timing requirement cannot be met. As a result, the fall time of the signal NVDD is delayed to ensure that node NCS has sufficient time to disable the SRAM 300. If the SRAM 300 is not placed into low power standby mode before node NVDD has fallen to level 414, the resultant high current flow through the resistor 306, as well as through the resistors 202 and 208 shown in FIG. 2, would cause a substantial voltage drop across the resistors. As a consequence, the voltage at node NVDD would fall substantially below the voltage of RTCVBAT, causing data retained in the SRAM 300 to be lost. Thus, the operation of the invention places the SRAM 300 into low power standby mode before the voltage NVDD is below RTCVBAT, so that the data is retained and is not lost.

When the computer system power is turned back on, the voltage +5V is driven high, as indicated by edge 420, causing the Schottky diode 304 to forward-bias. As a result, the voltage at node NVDD will rise relatively quickly, as indicated by edge 424, back to the voltage level of +5V less the Schottky diode voltage drop, preferably to approximately 4.7V. As discussed above, the voltage RTCVBAT when the computer is turned on will be clamped at 3.3V. Thus, the voltage difference between node NVDD and the voltage RTCVBAT will cause a current to flow through the resistor 306. The signal PGOOD is also asserted high when the computer is turned on, as indicated by edge 422, causing the transistor 310 to turn on, thereby allowing node NCS to rise to a high state, as indicated by edge 426. The specifications of the SRAM 300 require that node NVDD be brought to a high state at least 100 ns before node NCS is allowed to rise, as defined by parameter Trdr. This delay is primarily based on the delay of providing the PGOOD signal after the +5V supply is fully provided and stable. The delay is approximately 10 ms. Thus, the power supply voltage input of the SRAM 300 is brought back to a high state sufficiently early to allow the internal circuitry to adjust to the higher voltage before it is allowed to enter into active mode.

Thus, an EISA computer system is described that uses an SRAM to store the EISA configuration information, instead of the typically used EEPROM. An SRAM is generally cheaper than an EEPROM, allowing the manufacturer to build the computers at a lower cost. However, because the SRAM must be switched to the RTC/CMOS memory power supply voltage when the computer system is shut off, the power supply voltage input of the SRAM is switched from the system power voltage, which is approximately 5V, down to about the voltage of the RTC/CMOS memory voltage, which can range between 2.5 and 3V. If the power supply voltage input to the SRAM is switched to a lower value before the SRAM has entered into a low power standby mode, the operating current drawn by the SRAM would cause a large voltage drop across the resistive network coupling the SRAM to the battery that provides the power supply voltage when the computer is switched off. Therefore, a circuit is described that places the SRAM into low power standby mode before the power supply input to the SRAM is switched from a high state to a lower state.

The foregoing disclosure and description of the invention are illustrative and explanatory thereof, and various changes in the size, shape, materials, components, circuit elements, wiring connections and contacts, as well as in the details of the operation and construction may be made without departing from the spirit of the invention.

I claim:

1. A circuit for placing a memory device having a power supply voltage input and a select input for use in a computer system into a low power state when the computer system is shut off, the computer system having a power supply that provides a first voltage and a second voltage, the first voltage being higher then the second voltage, wherein the first voltage is deasserted when the computer system is shut off but the second voltage remains active, and wherein the select input being asserted high allows the memory device to enter into active mode and the select input being deasserted low causes the memory device to enter into low-power standby mode, the circuit comprising:

means connected to the memory device power supply voltage input and to the first and second voltages for connecting the power supply voltage input to the first voltage if the computer system is on and for connecting the power supply voltage input to the second voltage if the computer system is off;

means connected to the memory device power supply voltage input and said voltage connection means for gradually decreasing the voltage at the memory device power supply voltage input from the first voltage to the second voltage when the computer system is shut off; and means connected to the select input of the memory device for deasserting the voltage at the select input low before the voltage at the memory device power supply voltage input is decreased to the second voltage when the computer system is shut off.

2. The circuit of claim 1, wherein said voltage connection means comprises:

a diode having an anode and a cathode, said cathode being connected to the memory device power supply voltage input, and said anode being connected to the first voltage; and a resistor being connected between the memory device power supply voltage input and the second voltage.

3. The circuit of claim 2, wherein said gradual decreasing means comprises:

a capacitor connected between the memory device power supply voltage input and a ground voltage for providing a time constant that causes the voltage value at the memory device power supply voltage input to gradually decrease from the first voltage to the second voltage.

4. The circuit of claim 1, wherein said means for deasserting the voltage at the select input low further asserts the voltage at the select input high a predetermined amount of time after the computer system is turned on and the power supply voltage input is connected to the first voltage.

5. The circuit of claim 1, wherein the computer system further has means for providing a signal indicating that the first voltage is good and wherein said means for deasserting the voltage at the select input low comprises:

a transistor having a control input and a pass channel having an input and an output, wherein said pass channel is active when said control input is at a high level and said pass channel is open when said control input is at a low level, said control input is connected to said first voltage good signal, said pass channel input is connected to said first voltage and said pass channel output is coupled to said memory device select input; and a resistor connected to said memory device select input and a low level.

6. The circuit of claim 5, wherein said transistor is an NPN transistor.

7. A computer system, comprising:

a memory device having a power supply voltage input and a select input, wherein said select input being asserted high allows said memory device to enter into active mode and said select input being deasserted low causes said memory device to enter into low-power standby mode;

a power supply coupled to said memory device for providing a first voltage, a second voltage and a power good indicating signal, said first voltage being higher then said second voltage, wherein said first voltage and said power good indicating signal are deasserted when the computer system is shut off but said second voltage remains active, and wherein said power good indicating signal being asserted high and deasserted low is delayed from said first voltage being asserted high and deasserted low, respectively; and a circuit coupled to said memory device and said power supply for placing said memory device into a low power state when the computer system is shut off, said circuit comprising:

means responsive to said power good indicating signal and connected to said memory device select input for generating a select signal, wherein said select signal is asserted high when said power good indicating signal is asserted high and deasserted low when said select signal is deasserted low;

means connected to said first voltage, said second voltage and said memory device power supply voltage input for connecting said memory device power supply voltage input to said first voltage if said first voltage is high and for connecting said power supply voltage input to said second voltage if said first voltage is low; and means connected to said memory device power supply voltage input and said voltage connection means for gradually decreasing the voltage at said memory device power supply voltage input from said first voltage to said second voltage when said first voltage switches from a high state to a low state, such that said memory device is placed into a low power standby mode before the voltage at said memory device power supply voltage input has reached said second voltage.

8. The computer system of claim 7, wherein said voltage connection means comprises:

a diode having an anode and a cathode, said cathode being connected to said memory device power supply voltage input, and said anode being connected to said first voltage; and a resistor being connected between said memory device power supply voltage input and said second voltage.

9. The computer system of claim 7, wherein said gradual decreasing means comprises:

a capacitor connected between said memory device power supply voltage input and a ground voltage for providing a time constant that causes the voltage value at said memory device power supply voltage input to gradually decrease from said first voltage to said second voltage.

10. The circuit of claim 7, wherein said means for deasserting the voltage at the select input low further asserts the voltage at the select input high a predetermined amount of time after the computer system is turned on and the power supply voltage input is connected to the first voltage.

11. The circuit of claim 7, wherein the computer system further has means for providing a signal indicating that the first voltage is good and wherein said means for deasserting the voltage at the select input low comprises:

a transistor having a control input and a pass channel having an input and an output, wherein said pass channel is active when said control input is at a high level and said pass channel is open when said control input is at a low level, said control input is connected to said first voltage good signal, said pass channel input is connected to said first voltage and said pass channel output is coupled to said memory device select input; and a resistor connected to said memory device select input and a low level.

12. The circuit of claim 11, wherein said transistor is an NPN transistor.

* * * * *

UNITED STATES PATENT AND TRADEMARK OFFICE
CERTIFICATE OF CORRECTION

PATENT NO. : 5,384,747
DATED : January 24, 1995
INVENTOR(S) : Steven J. Clohset

It is certified that error appears in the above-identified patent and that said Letters Patent is hereby corrected as shown below:

Column 2,
Line 6, delete "non-volatile" insert -- volatile --.

Signed and Sealed this

Tenth Day of January, 2006

JON W. DUDAS
*Director of the United States Patent and Trademark Office*